(12) United States Patent
Levy

(10) Patent No.: US 7,254,788 B2
(45) Date of Patent: Aug. 7, 2007

(54) NONLINEAR DRIVER MODEL FOR MULTI-DRIVER SYSTEMS

(75) Inventor: Harold J. Levy, Los Gatos, CA (US)

(73) Assignee: Synopsys, Inc., Mountain View, CA (US)

( * ) Notice: Subject to any disclaimer, the term of this patent is extended or adjusted under 35 U.S.C. 154(b) by 313 days.

(21) Appl. No.: 10/976,487

(22) Filed: Oct. 29, 2004

(65) Prior Publication Data

US 2006/0095869 A1    May 4, 2006

(51) Int. Cl.
*G06F 17/50* (2006.01)
*G06F 19/00* (2006.01)

(52) U.S. Cl. ................... 716/1; 716/4; 702/66
(58) Field of Classification Search ............ 716/1, 716/4; 702/66
See application file for complete search history.

(56) References Cited

U.S. PATENT DOCUMENTS

| | | | |
|---|---|---|---|
| 6,230,304 B1* | 5/2001 | Groeneveld et al. ......... | 716/7 |
| 7,065,720 B2* | 6/2006 | Croix ......................... | 716/1 |
| 2003/0188267 A1* | 10/2003 | Lehner et al. .............. | 716/1 |
| 2004/0049748 A1* | 3/2004 | Croix ......................... | 716/4 |
| 2004/0249588 A1* | 12/2004 | Shimazaki et al. ......... | 702/66 |

OTHER PUBLICATIONS

Arunachalam et al.: "CMOS Gate Delay Models For General RLC Loading", Proceedings of the 1997 Int'l Conference on Computer Design (ICCD '97), IEEE 1997, 6 pgs.
Dartu et al.: "Performance Computation For Precharacterized CMOS Gates With RC Loads", IEEE Transactions on Computer-Aided Design of Integrated Circuits and Systems, vol. 15, No. 5, May 1996, pp. 544-553.

* cited by examiner

*Primary Examiner*—Stacy A. Whitmore
*Assistant Examiner*—Magid Y. Dimyan
(74) *Attorney, Agent, or Firm*—Bever, Hoffman & Harms, LLP; Jeanette S. Harms

(57) ABSTRACT

A precharacterized cell library for EDA tools includes driver model data includes output current signals indexed by output voltages. The driver model can then generate a model output by interpolating the output current signals using the output voltage to generate an output current. The output current can then be used to generate an updated output voltage across a predetermined time increment. The output current signals can then be interpolated using the updated output voltage to generate a new output current, when can be used to update the output voltage once again across the next time increment. By repeating this process across a time frame for the model output signal, a model output current and output voltage signals can be generated that match the actual output current and voltage signals from a driver in a multi-driver system.

12 Claims, 14 Drawing Sheets

NONLINEAR DRIVER MODEL FOR MULTI-DRIVER SYSTEMS

BACKGROUND OF THE INVENTION

1. Field of the Invention

The invention relates to the field of integrated circuit modeling, and in particular to a system and method for accurately representing the effects of multi-drive conditions.

2. Related Art

An electronic design automation (EDA) system is a computer software system used for designing integrated circuit (IC) devices. The EDA system typically receives one or more high level behavioral descriptions of an IC device (e.g., in HDL languages like VHDL, Verilog, etc.) and translates ("synthesizes") this high-level design language description into netlists of various levels of abstraction. A netlist describes the IC design and is composed of nodes (functional elements) and edges, e.g., connections between nodes. At a higher level of abstraction, a generic netlist is typically produced based on technology independent primitives.

The generic netlist can be translated into a lower level technology-specific netlist based on a technology-specific (characterized) cell library that has gate-specific models for each cell (i.e., a functional element, such as an AND gate, an inverter, or a multiplexer. The models define performance parameters for the cells; e.g., parameters related to the operational behavior of the cells, such as power consumption, output slew, delay, and noise. The netlist and cell library are typically stored in computer readable media within the EDA system and are processed and verified using many well-known techniques.

FIG. 1 shows a simplified representation of an exemplary digital ASIC design flow. At a high level, the process starts with the product idea (step E100) and is realized in an EDA software design process (step E110). When the design is finalized, it can be taped-out (event E140). After tape out, the fabrication process (step E150) and packaging and assembly processes (step E160) occur resulting, ultimately, in finished chips (result E170).

The EDA software design process (step E110) is actually composed of a number of steps E112-E130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step E110) will now be provided. During system design (step E112), the designers describe the functionality that they want to implement and can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

During logic design and functional verification (step E114), the VHDL or Verilog code for modules in the system is written and the design is checked for functional accuracy. More specifically, the design is checked to ensure that it produces the correct outputs. Exemplary EDA software products from Synopsys, Inc. that can be used at this step include VCS, VERA, DesignWare®, Magellan, Formality, ESP and LEDA products.

During synthesis and design for test (step E116), the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

During design planning (step E118), an overall floorplan for the chip is constructed and analyzed for timing and top-level routing. Exemplary EDA software products from Synopsys, Inc. that can be used at this step include Jupiter and Floorplan Compiler products.

During netlist verification (step E120), the netlist is checked for compliance with timing constraints and for correspondence with the VHDL/Verilog source code. Exemplary EDA software products from Synopsys, Inc. that can be used at this step include VCS, VERA, Formality and PrimeTime products.

During physical implementation (step E122), placement (positioning of circuit elements) and routing (connection of the same) is performed. Exemplary EDA software products from Synopsys, Inc. that can be used at this step include the Astro product.

During analysis and extraction (step E124), the circuit function is verified at a transistor level, this in turn permits what-if refinement. Exemplary EDA software products from Synopsys, Inc. that can be used at this step include Star RC/XT, Raphael, and Aurora products.

During physical verification (step E126), various checking functions are performed to ensure correctness for: manufacturing, electrical issues, lithographic issues, and circuitry. Exemplary EDA software products from Synopsys, Inc. that can be used at this step include the Hercules product.

During resolution enhancement (step E128), geometric manipulations of the layout are performed to improve manufacturability of the design. Exemplary EDA software products from Synopsys, Inc. that can be used at this step include the iN-Phase, Proteus, and AFGen products.

Finally, during mask data preparation (step E130), the "tape-out" data for production of masks for lithographic use to produce finished chips is performed. Exemplary EDA software products from Synopsys, Inc. that can be used at this step include the CATS(R) family of products.

As indicated in FIG. 1, timing analyses can be performed at various points along the EDA process, such as during synthesis, design planning, netlist verification, and analysis (as indicated by the bolded chevrons). The accuracy of these timing analyses is critical to the quality of final IC produced using EDA systems. To perform a timing analysis, the IC design (or a portion of the IC) is defined as a network of drivers and receivers. Cells designated as drivers provide stimuli to the network, and the resulting waveforms are received by the cells designated as receivers.

For example, FIG. 2 shows a schematic diagram of a sample driver-receiver network 200 that includes a driver (cell) 210 and a receiver (cell) 230. An input pin 211 of driver 210 receives a driver input signal S_IND and generates a driver output signal S_OUTD at a driver output pin 212. This signal is transmitted across an interconnect element 220 and is received as a receiver input signal S_INR at a receiver input pin 231 of receiver 230 (depicted as an inverter for exemplary purposes). Receiver 230 processes receiver input signal S_INR and generates a receiver output signal S_OUTR at a receiver output pin 232. Note that receiver 230 can also function as a driver for downstream cells, as indicated by load 240 connected to receiver output pin 232.

Conventional driver models represent transistor behavior by indexing the output voltage behavior of the driver by input slew and output capacitance. For example, FIG. 3A shows a conventional driver model 210A for modeling driver cell 210 shown in FIG. 2. Driver model 210A includes a time-dependent voltage source V210A in series with a drive resistor R210A and driver output pin 212A, and an output capacitor C210A coupled between pin 212A and ground. Driver model 210A is sometimes referred to as a "Thevenin model". Driver model 210A is precharacterized by applying a range of driver input signals S_INA to input pin 211A across a range of capacitance values C1 through CN for output capacitor C210A (via SPICE simulations or actual device measurements). Each input signal S_INA exhibits a particular input slew SI (i.e., the time required for the signal to go from one logic state to the opposite logic state) and a particular input delay time TDI (i.e., the time at which input signal S_INA reaches a threshold level (generally 50% of the signal swing)). The output voltage signals V_OUT(t) generated in response to the various input signals S_INA each exhibit a particular output slew SO and an output delay time TDO. By subtracting the input delay time TDI of an input signal S_INA from the output delay time TDO of an associated output signal S_OUTA, an output delay value DOUT can be determined. The output slew SO and the output delay value DOUT for each of output signals S_OUTA can then be indexed by input slew SI and output capacitance values C1 through CN in a precharacterized library cell entry for driver cell 210.

Thus, conventional precharacterized library cell entries for driver cells generally include output voltage curve characteristics (i.e., output slew and output delay) as precharacterization output signals, with output capacitance, input slew, and signal type acting as indexing parameters. For example, FIG. 3B shows a precharacterized library cell entry 300 generated by driver model 210A in FIG. 3A. Cell entry 300 includes a set of precharacterized driver output signal data stored as output delays DOxx and output slews SOxx indexed by input slews SI1 through SI4 and output capacitances C1 through C4. Thus, for example, output delay DO11 is indexed by input slew SI1 and output capacitance C1. Output slew SO11 is indexed by the same indexing parameter values (i.e., input slew SI1 and output capacitance C1). In some cases, a driver cell may be associated with separate library entries for output delay and output slew (i.e., output delay and output slew values that are indexed by separate sets of input slew and output capacitance values).

Note that because the behavior of a cell can vary according to the type of signal being applied to that cell, the output delay and output slew values in cell entry 300 can also be indexed according to input signal type (i.e., rising signals, falling signals, "best case" (fastest) transitions, and "worst case" (slowest) transitions). Thus, for example, output delay value DO14 (circled) can include a set of output delay values DO14-R, DO14-F, DO14-B, and DO14-W, which correspond to rising, falling, "best case", and "worst case" signals, respectively.

The precharacterized signal data stored in cell entry 300 can be then used during timing analyses to derive a model driver output signal based on the model output capacitance (and signal type). For example, FIG. 3C shows a graph of rising driver output signals V_OUT(t)-11, V_OUT(t)-12, V_OUT(t)-13, and V_OUT(t)-14 (generated according to the precharacterization output delay and output slew values indexed by output capacitances C1, C2, C3, and C4, respectively, and input slew SI1 in cell entry 300 in FIG. 3B). To perform a timing analysis on a model driver cell, a model output capacitance value C5 is determined for that driver cell (based on the characteristics of the cell). For exemplary purposes, model output capacitance value C5 is selected to be between precharacterization output capacitance values C2 and C3. A model driver output signal V_OUT(t)-INT (C5) can then be interpolated from the precharacterized driver output signals V_OUT(t)-12 and V_OUT(t)-13 (associated with output capacitance values C2 and C3, respectively). Output slew and delay values for the model driver cell can then be derived from model driver output signal V_OUT(t)-INT(C5). Alternatively, output slew and delay values for the model driver cell can be directly interpolated from the precharacterization output delay and slew values of cell entry 300 in FIG. 3B.

As the devices used to instantiate the driver cells in a system continue to shrink, the driver cells formed from those devices begin to exhibit increasingly complex output current responses that are not adequately described by output slew and delay values. For example, reduced device dimensions generally result in faster circuits, which in turn requires greater modeling accuracy. To provide this enhanced modeling accuracy, the nuances of device behavior (in particular output current behavior) must be properly captured. Therefore, modern EDA tools have begun to incorporate output current-based schema (rather than output delay/slew-based schema) for cell modeling.

For example, FIG. 4 shows a driver model 210B for modeling driver cell 210 shown in FIG. 2. Driver model 210B includes a time-dependent voltage source V210B in series with a drive resistor R210B and driver output pin 212B, and an output capacitor C210B coupled between pin 212B and ground (Thevenin model). Driver model 210B is therefore substantially similar to driver model 210A shown in FIG. 3A, except that model 210B is precharacterized by measuring output current signals I_OUTB(t) across a range of input slews SI and output capacitance values C1 through CN. The output current signals I_OUT(t) can then be compiled in a precharacterized library cell entry for driver cell 210. An example of this output current-based approach is described in co-owned, co-pending U.S. patent application Ser. No. _____ [docket SNSY-A2001-011].

However, while an output current-based approach can provide greater modeling accuracy for small device effects, indexing output current according to output capacitance requires that the output capacitor be fully charged or fully discharged at the start of the output current signal (i.e., the output capacitor must initially be at a known state at one of the power rails). Unfortunately, this assumption cannot be made in a systems that includes multiple driver cells operating at different times (i.e., "multi-driver" systems).

For example, FIG. 5A shows a system 500 that includes an aggressor driver cell A510 and a victim driver cell V510. Aggressor driver cell A510 is modeled as a resistor R_AGG and an output capacitor C_AGG, and is configured to generate an output signal S_OUTDA from an input signal S_INDA. Victim driver cell V510 is modeled as a resistor R_VIC and an output capacitor C_VIC, and is configured to generate an output signal S_OUTDV from an input signal S_INDV. The outputs of aggressor driver cell A510 and victim driver cell V510 are parasitically coupled, as indicated by capacitor C_PAR.

Because of this parasitic coupling, crosstalk can exist between aggressor driver cell A510 and victim driver cell V510. For example, if aggressor driver cell A510 is switching in the same direction as victim driver cell V510, output signal S_OUTDV from victim driver cell V510 could exhibit a slew much greater than the typical best case (i.e., no load) slew value. On the other hand, if aggressor driver cell A510 is switching in the opposite direction from victim driver cell V510, output signal S_OUTDV from victim driver cell V510 can exhibit a significantly decreased slew.

Furthermore, if aggressor driver cell A510 begins switching before victim driver cell V510, the output of victim driver cell V510 can actually be pulled outside of the circuit power rails. For example, FIG. 5B shows a sample graph of output signal S_OUTDV generated by victim driver cell V510 for the situation when aggressor driver cell A510 starts a falling transition before victim driver cell V510 begins switching. Victim output signal S_OUTDV is initially pulled below ground (0.0 V) before beginning its upward trajectory. Because conventional output current-based driver models require that initial capacitance states be well-defined (i.e., voltage at one of the power rails), such models are not well-equipped to deal with multi-driver systems (i.e., systems that are faced with crosstalk among driver cells).

Thus, conventional cell driver models can be inadequate for the timing analysis of modern IC designs. Accordingly, it is desirable to provide a cell driver model that can accurately represent the behavior of a driver cell in a multi-driver system.

SUMMARY OF THE INVENTION

Conventional cell libraries generally do not contain precharacterization data that can be effectively used to model driver cells in multi-driver systems. To overcome this modeling limitation, a cell library entry can include a set of output current signals indexed by a set of precharacterization output voltage values. In various embodiments, the set of output current signals can also be indexed by various combinations of input slew and input signal type. By indexing output current by output voltage (rather than by output capacitance), and by selecting the set of precharacterization output voltages to have a range greater than the rail-to-rail power supply range of the driver cell, driver cell output behavior that falls outside the power rails of the system (e.g., due to aggressor effects on a victim) can be accurately modeled. In another embodiment, a cell library can include an impedance compensation factor(s) to represent the effects of the dynamic output impedance of the driver.

In another embodiment, a cell library can be created by selecting a set of precharacterization output voltages for a driver model, generating a set of output current signals by holding the output of the driver model at each of the precharacterization output voltages while applying the same input signal to the driver model, compiling the set of output current signals into a library cell entry for the driver model, and indexing the output current signals in the library cell entry by the precharacterization output voltages and the input signal. In one embodiment, impedance compensation factors can be associated with one or more of the output current signals in the library cell entry to enable modeling of the effects of the dynamic output impedance of the driver. In another embodiment, the set of precharacterization output voltages can be selected to have a range greater than or equal to the expected range of output voltages for the driver cell during normal operation. In another embodiment, the particular precharacterization output voltages within that range can be closer together where output current is more sensitive to output voltage, and can be farther apart where output current is less sensitive to output voltage.

In another embodiment, a driver cell can be modeled by defining an input signal for the driver cell, extracting a set of output current signals indexed by the input signal (and also by output voltage) from a library cell entry for the driver cell, defining an initial output voltage for the driver cell, and generating an model output signal for the driver cell by time stepping through the duration of the output signal. Time stepping is performed by deriving an evaluation current at a given time by interpolating between the set of output current signals using the output voltage, adjusting the output voltage according to the evaluation current and a predetermined time increment (and a model output capacitance), deriving a new evaluation current at the new time (previous time plus the time increment) by interpolating between the output current signals using the adjusted output voltage, and looping through this process for the duration of the model signal. Note that this process generates both a model output current signal and a model output voltage signal for the driver cell. In one embodiment, adjusting the output voltage can be performed using an impedance compensation factor(s) associated with the output current signals in the library cell entry.

In another embodiment, a system for generating a precharacterized cell library can include logic for generating a set of precharacterization output voltages, logic for generating a set of output current signals by applying an input signal to a driver cell while holding the output of the driver cell at each of the precharacterization output voltages, and logic for compiling the output current signals into a library cell entry for the driver cell and indexing the output current signals in that library cell entry by the precharacterization output voltages and the input signal. In one embodiment, the system can further include logic for generating impedance compensation factors for one or more of the output current signals in the library cell entry that enable modeling of the effects of the dynamic output impedance of the driver. In one embodiment, the logic for generating the set of precharacterization output voltages can include logic for generating current-voltage response curves for the driver cell, logic for segmenting the current-voltage response curves according to the sensitivity of the output current to the output voltage, and logic for compiling the voltages associated with the segmented curves into the set of precharacterization output voltages.

The invention will be more fully understood in view of the following description and drawings.

DETAILED DESCRIPTION

Figure 1:
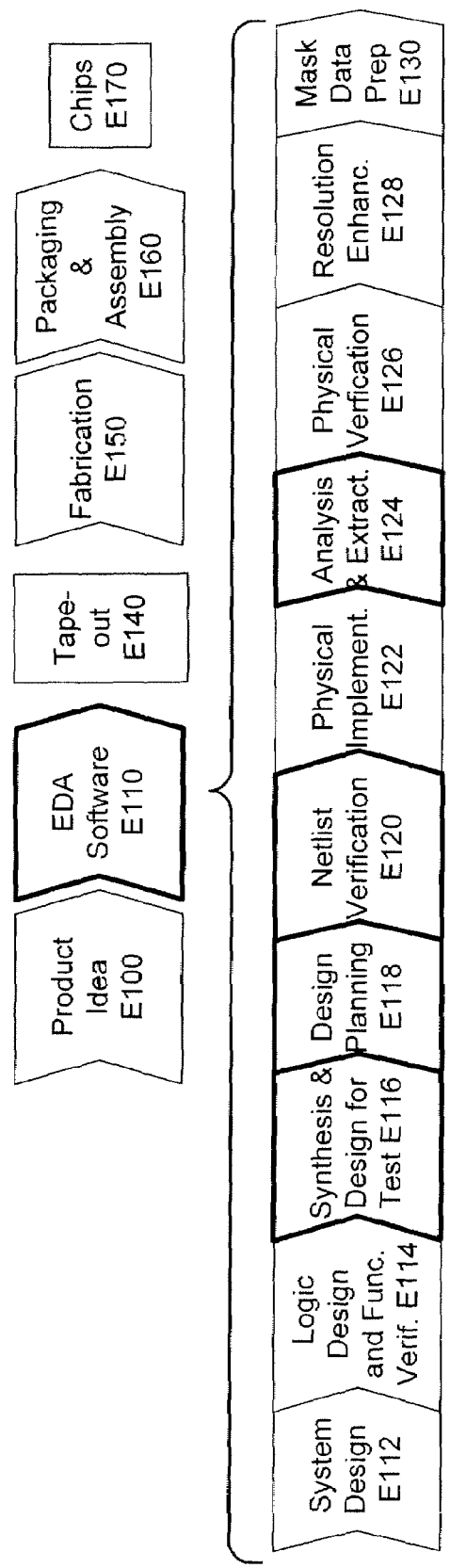
FIG. 1 is a process flow diagram for a general EDA design flow.
Figure 2:
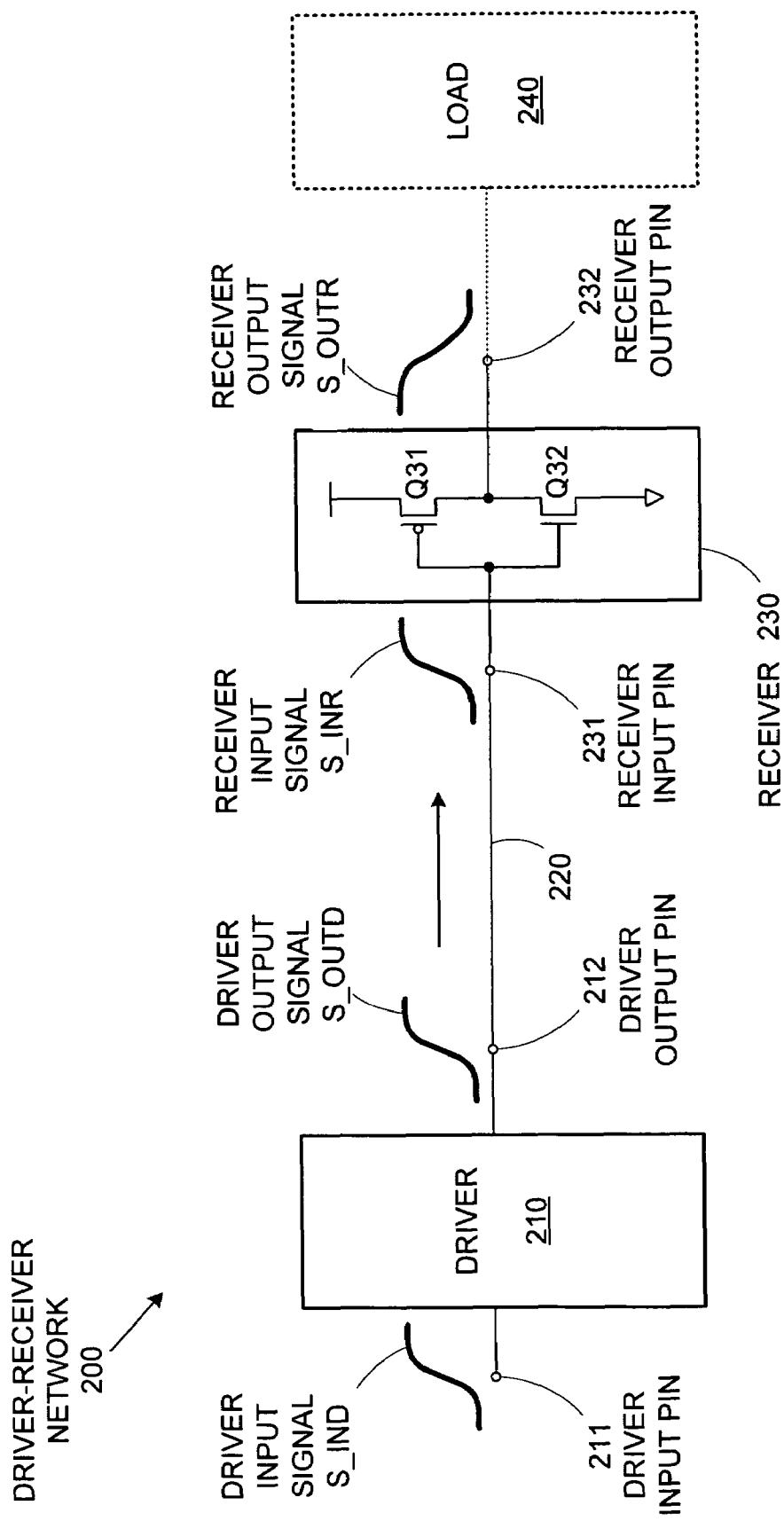
FIG. 2 is a schematic diagram of a sample driver-receiver network.
Figure 6A:
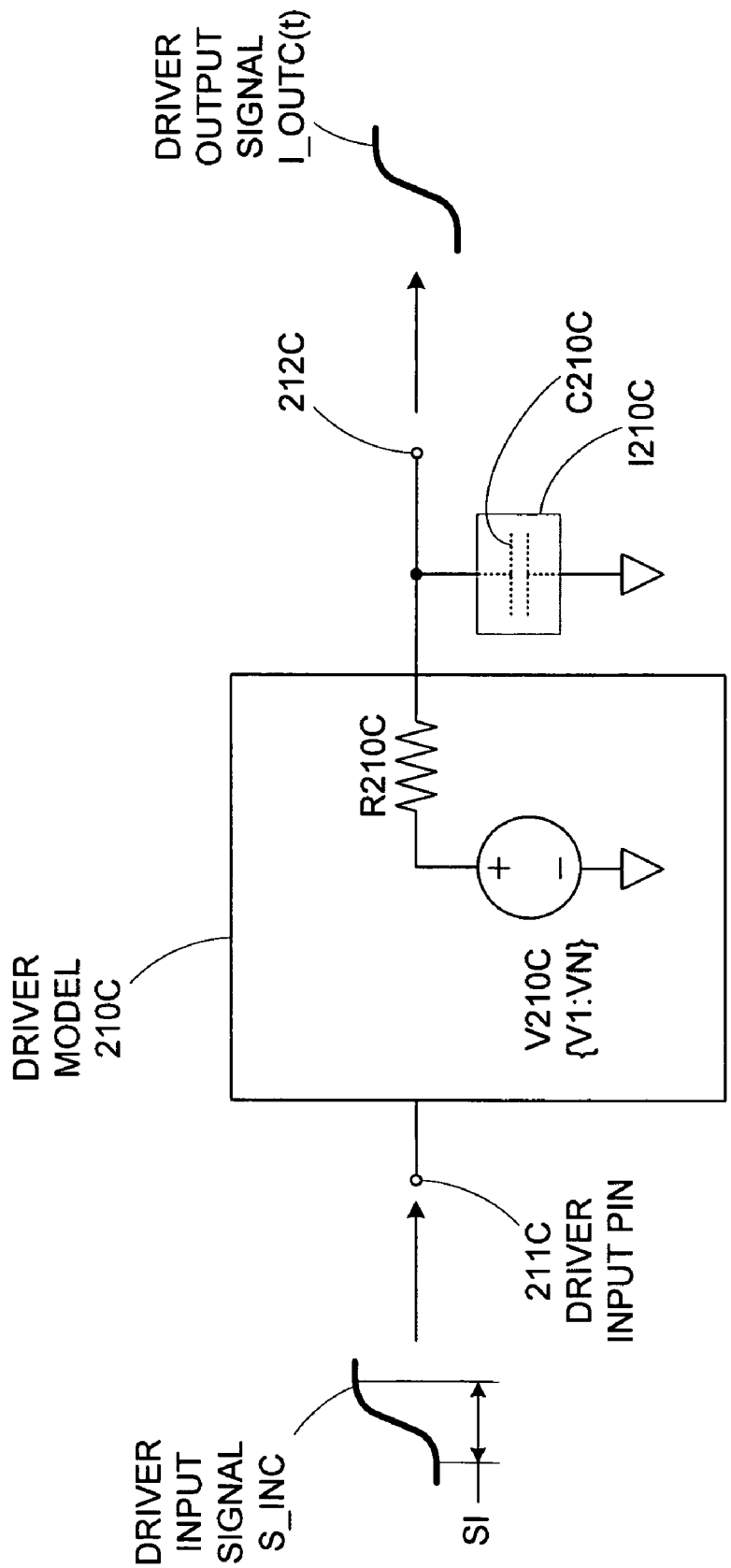
FIG. 6A is a schematic diagram of a driver model that indexes output current by output voltage.

Because of the dynamic effects that become more prominent as device geometries decrease in size and systems that incorporate those devices increase in complexity, conventional capacitance-indexed driver cell models are often unable to accurately model driver performance. FIG. 6A shows an embodiment of a driver model 210C for driver cell 210 (shown in FIG. 2) that indexes driver output current by driver output voltage to overcome the limitations of conventional driver model. Driver model 210C includes a driver input pin 211C, a time-independent (constant) voltage source V210C in series with a drive resistor R210C and driver output pin 212C, and an optional impedance element I210C. Voltage source V210C holds output pin 212C at predetermined voltages V1 through VN across a range of driver input signals S_INC at input pin 211C to generate set of output current signals I_OUTC(t) (i.e., for particular driver input signal S_INC, a different driver output signal I_OUTC(t) is generated for each output voltage V provided by voltage source V210C). The output current signals I_OUTC(t) can then be compiled in a precharacterized library cell entry for driver cell 210. Note that in one embodiment, during generation of this output current precharacterization data, various circuit elements can be implemented within optional impedance element I210C to account for the dynamic (reactive) output impedance of the driver. For example, a single static output capacitor C210C (which can have different capacitance values for different modeling conditions) can be used to model the effect of the consituent wire elements to which the output routing of the driver is attached.

Figure 3A:
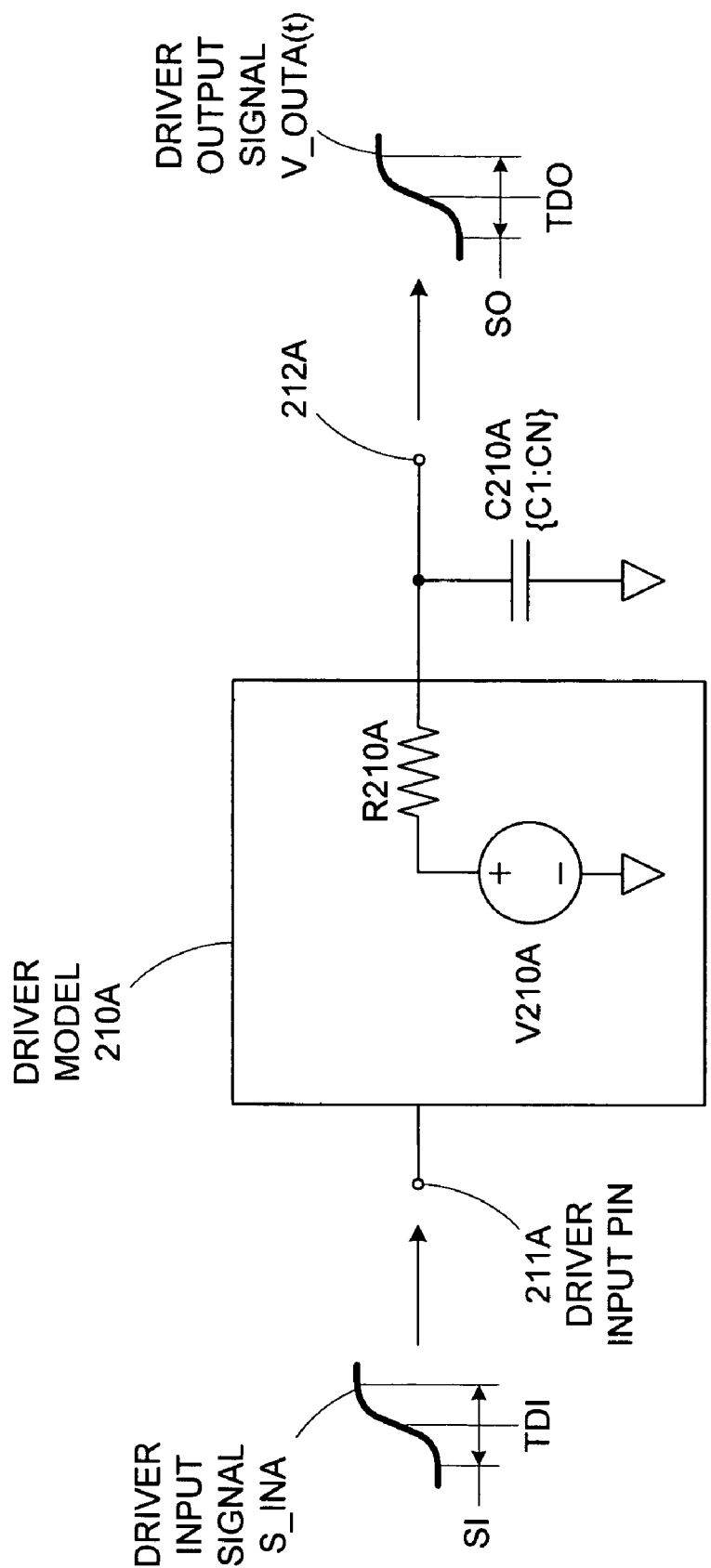
FIG. 3A is a schematic diagram of a conventional driver model that indexes output delay and output slew by input slew and output capacitance.
Figure 3B:
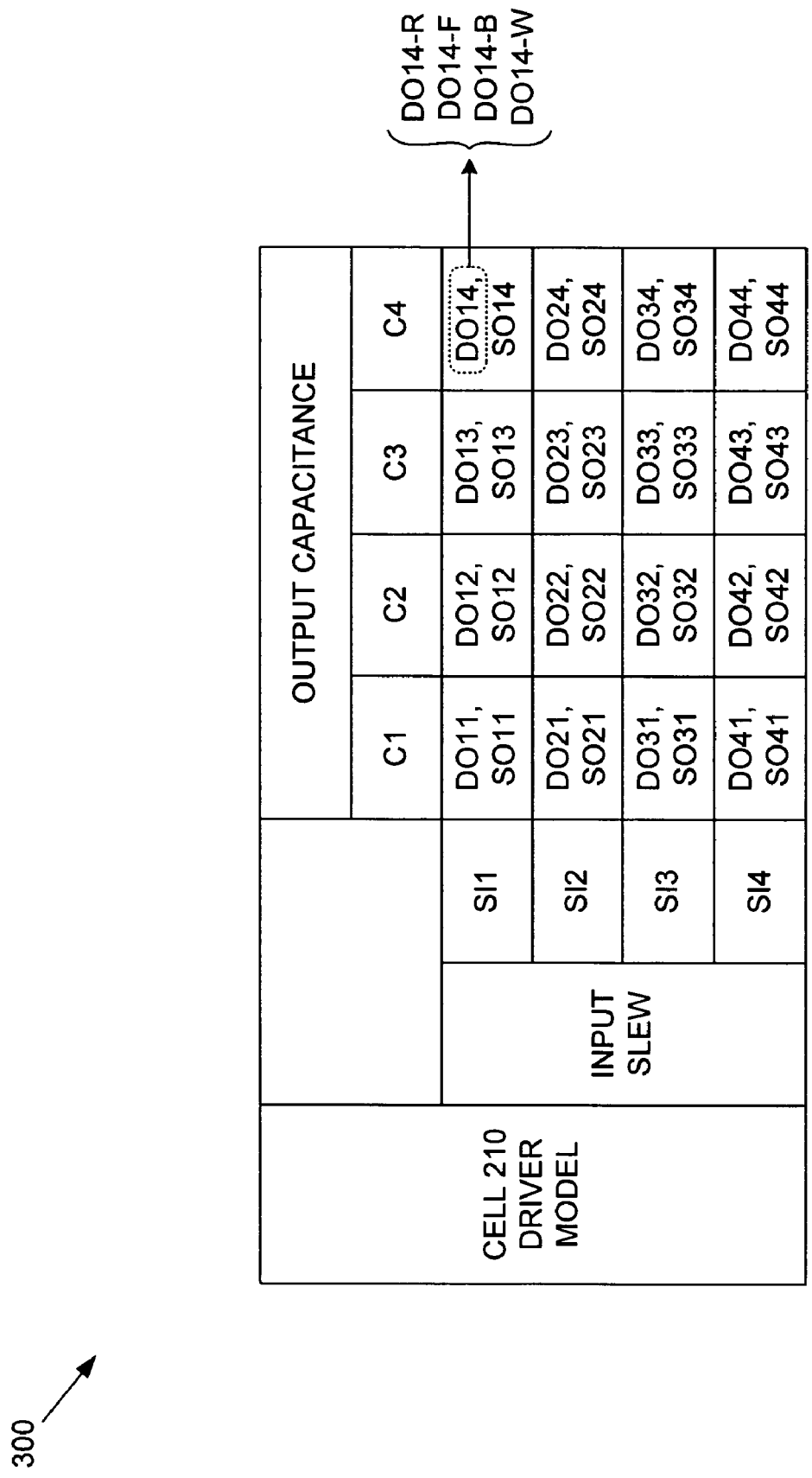
FIG. 3B is a sample cell entry for a conventional driver model in a cell library.
Figure 3C:
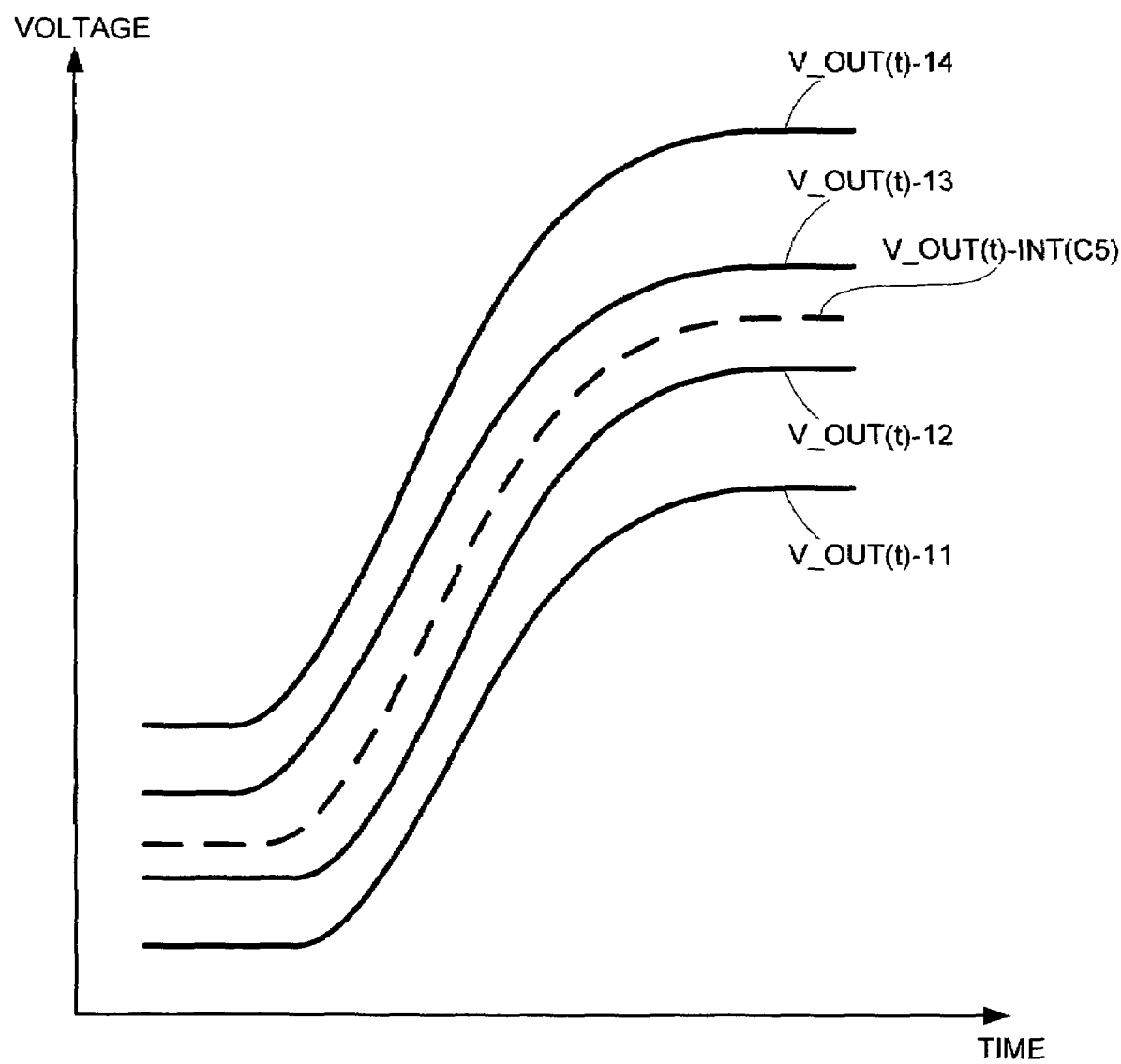
FIG. 3C is a graph depicting conventional driver modeling using output voltage signals.
Figure 4:
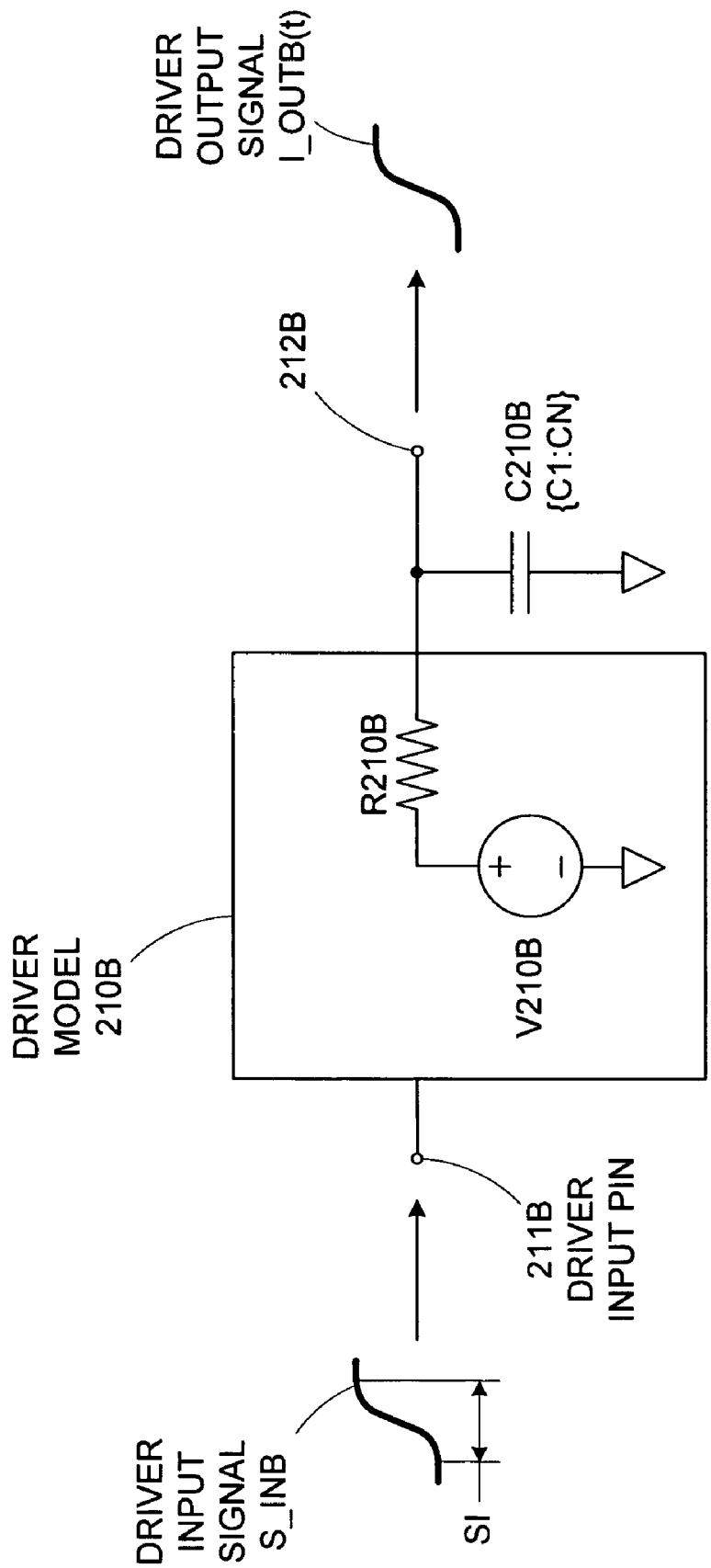
FIG. 4 is a schematic diagram of a conventional driver model that indexes output current by output capacitance.
Figure 6B:
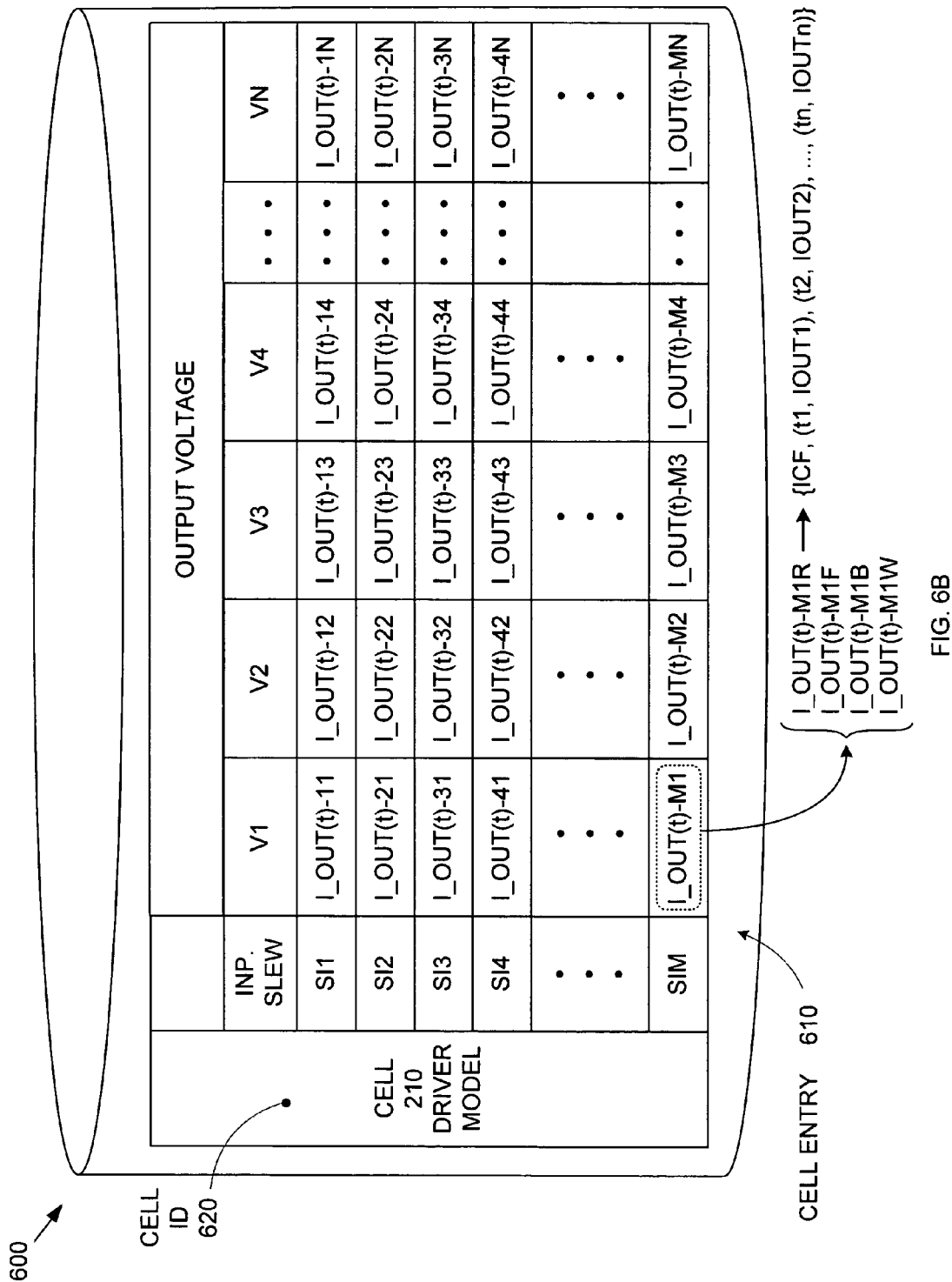
FIG. 6B is a sample cell library that includes output current signals indexed by output voltages.

FIG. 6B shows an exemplary precharacterized cell library 600 that includes a cell entry 610 generated by driver model 210C in FIG. 6A. Cell entry 600 includes a cell ID 620 and a set of model definition data that includes a set of precharacterized driver output signals I_OUT(t) indexed by a set of precharacterization input slews SI1-SIM and output voltages V1-VN. Thus, for example, output current signal I_OUT(t)-11 is indexed by input slew SI1 and output voltage V1. Note that in various embodiments, signals I_OUT(t) can also be indexed by additional modeling parameters, such as the input signal types described above with respect to FIG. 3B (i.e., rising, falling, "best case", and "worst case" signals). Thus, for example, output signal I_OUT(t)-M1 (circled by a dotted line) can actually comprise a set of output signals I_OUT(t)-M1R, I_OUT(t)-M1F, I_OUT(t)-M1B, and I_OUT(t)-M1W, which correspond to rising, falling, "best case", and "worst case" signals, respectively.

Note that in the context of a cell library, an "output signal" refers to an output signal data set. For example, each output signal I_OUT(t) can be stored as a collection of data points, with each data point representing an output current value at a given time for the indexing parameter values associated with the output signal. For example, output signal I_OUT (t)-M1R can be stored as a set of points (t1, IOUT1), (t2, IOUT2), ... (tn, IOUTn), with t1-tn representing specific time values and IOUT1-IOUTn, respectively, representing the output current values at those time values.

Note that output signal I_OUT(t)-M1R is also associated with an optional impedance compensation factor ICF that represents the effect of the dynamic output impedance of the driver (e.g., output impedance element I210C in FIG. 6A). As described above with respect to FIG. 6A, impedance compensation factor ICF can comprise any impedance value, values, or function that can be used to model the effect of the driver dynamic output impedance. For example, in one embodiment, impedance compensation factor ICF can be a single capacitance value. In other embodiments, impedance compensation factor ICF can comprise multiple capacitance values that are associated with particular output values or ranges. Various other values or functions for inpedance compensation factor ICF will be readily apparent. In various embodiments, individual impedance compensation factors can be assigned to each output signal I_OUT(t), while in various other embodiments, a single impedance compensation factor can be assigned to multiple output signals I_OUT (t).

Figure 7A:
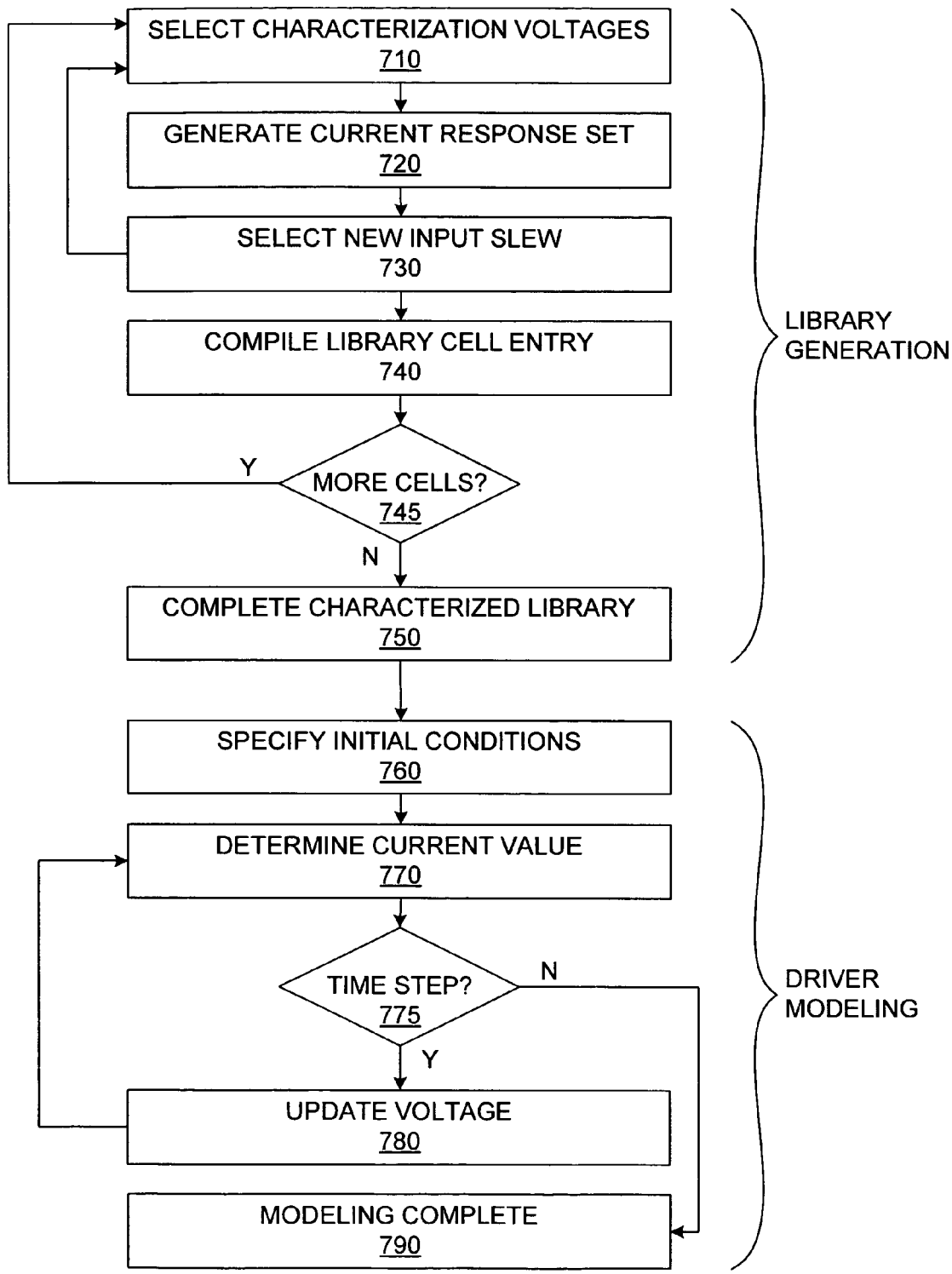
FIG. 7A is a flow diagram of a library generation and modeling process that incorporates current output signals indexed by output voltages.

FIG. 7A shows an exemplary flow diagram of a process for generating precharacterized cell library 600 (i.e., "LIBRARY GENERATION"), and a subsequent modeling process using the precharacterized cell library (i.e., "DRIVER MODELING"). Note that while the LIBRARY GENERATION and DRIVER MODELING processes are depicted in a single flow diagram for exemplary purposes, the processes need not be performed in immediate succession.

To begin the LIBRARY GENERATION process, a set of output voltages (e.g., V1-VN in FIG. 6A) is selected for use in the characterization operation in a "SELECT CHARACTERIZATION VOLTAGES" step 710. In one embodiment, the actual precharacterization voltages can be selected such that the overall range of the precharacterization output voltages is greater than or equal to the expected range of output voltages of the driver cell during operation. Consequently, the eventual precharacterized library cell entry can capture the output terminal behavior of a driver cell for regions outside the normal power rails of the system.

Then, in a "GENERATE CURRENT RESPONSE SET" step 720, a set of output current signals (e.g., I_OUT(t) in FIG. 6A) are generated for each output voltage using the same input slew (and any other indexing parameter(s), such as input signal type). A "SELECT NEW INPUT SLEW" step 730 allows a different input slew to be selected, and the process can loop back to step 710, and a new set of output current signals can be generated from the new input slew (using either the same or a different set of characterization output voltages). The resulting output current signals can then be stored as a library cell entry (e.g., cell entry 600 in FIG. 6B) in a "COMPILE LIBRARY CELL ENTRY" step 740. If additional cells remain to be precharacterized, a "MORE CELLS?" step 745 loops the process back to step 710. Otherwise, the precharacterized cell library is finalized in a "COMPLETE precharacterized LIBRARY" step 750, thereby completing the "LIBRARY GENERATION" process.

To begin the DRIVER MODELING process, initial conditions including input slew and output voltage (at the driver output pin) are defined in a "SPECIFY INITIAL CONDITIONS" step 760. For example, in one embodiment, no DC path exists between the victim (driver) and aggressor networks, the driver output pin can be set to an expected initial steady state voltage. Alternatively, in another embodiment, if a DC path does exist between the victim and aggressor networks, the DC operating point at the initial time could be determined for the driver output pin. Note that further that if driver output pin modeling is required, such modeling can be applied to the driver model during step 760 (e.g., adding a static capacitance to the driver output pin).

Then, using the precharacterization output current-signals (I_OUT(t)) stored in the library cell entry, an initial output current is derived from those initial conditions in a "DETERMINE CURRENT VALUE" step 770. Specifically, the set of output current signals indexed by the input slew defined in step 760 is identified. Note that in one embodiment, if the model input slew does not match any of the precharacterization input slews stored in the library cell entry, the set of precharacterization output current signals extracted from the library cell entry can be generated via interpolation of the stored precharacterization output current signals according to the model input slew. Each of the set of output current signals is further indexed by a particular output voltage value (as shown in FIG. 6B), so that using the initial condition output voltage specified in step 760, an initial current value can be determined by interpolating the output current signals.

Once a current value is determined, the model driver output signal is "time stepped" in a "TIME STEP?" step 775. Specifically, the model driver output signal can be generated by dividing the overall time period for the model driver output signal into multiple time increments, thereby allowing current and voltage determinations to be made at each time increment. The time stepping can be performed using any desired method, including backward/forward-Euler integration, trapezoidal integration, or Gear integration, among others. In one embodiment, an associated output impedance compensation factor(s) can be applied during step 775 to model the effect of the dynamic output impedance of the driver. To increase model accuracy, the number of time increments can be increased, while the number of time increments can be decreased to reduce calculation time. In step 775, the process checks to see if additional portions of the model driver output signal remain to be modeled. If so, the process continues to an "UPDATE VOLTAGE" step 780. Otherwise, the model driver output signal (and hence, the DRIVER MODELING process) is completed at a "MODELING COMPLETE" step 790.

In step 780, the output current value determined in step 770 is used to calculate a new driver output voltage. For example, the output current value can be multiplied by the time increment and then divided by an output capacitance associated with the driver model to determine a voltage change, and this voltage change can be added to the voltage existing driver output voltage to generate the updated driver output voltage. Note that the output capacitance of the driver model can be specified in step 760 or can be retrieved from the library cell entry used in step 770.

The process then loops back to step 770, where the updated output voltage calculated in step 780 is used to determine a new output current value for the model driver cell (using the same set of output current signals selected previously). The new output current value is used to generate a new output voltage value in step 780, and the process continues in this manner until the entire model driver output signal (actually both current and voltage output signals) is generated.

Figure 7B:
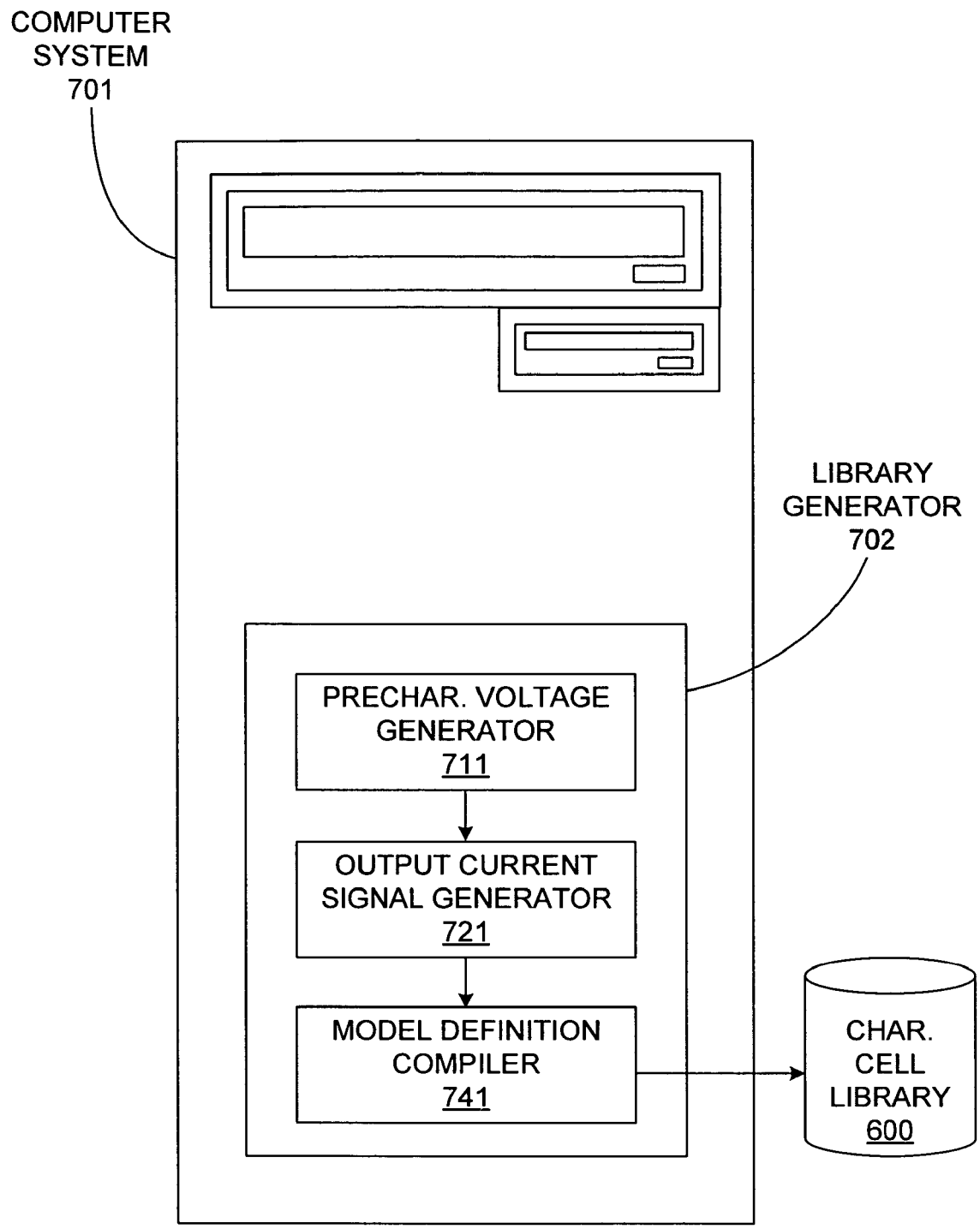
FIG. 7B is a diagram of a computing system that includes logic for generating a precharacterized cell library that includes output current signals indexed by output voltage.

FIG. 7B shows a block diagram of a computer system 701 that includes a library generator 702 for generating characterized cell library 600 (as shown in FIG. 6B). The embodiment of library generator 702 shown in FIG. 7B includes a precharacterization voltage generator 701 for generating a set of precharacterization output voltage values (step 710 in FIG. 7A), an output current signal generator 721 for generating output current signals for each of the set of precharacterization output voltage values (step 720 in FIG. 7A), and a model definition compiler 741 for compiling the model definition data (one or more sets of such data generated by generators 711 and 721) into a characterized cell library 600 that indexes output current signals by output voltage. In one embodiment, model definition compiler 741 can include logic for generating impedance compensation factors for the model definition data and incorporating those impedance compensation factors into characterized cell library 600. Characterized cell library 600 can be written to some form of computer-readable medium, such as memory within computer system 701, a removable storage medium (e.g., CDROM or DVD), or a network storage location.

Figure 8A:
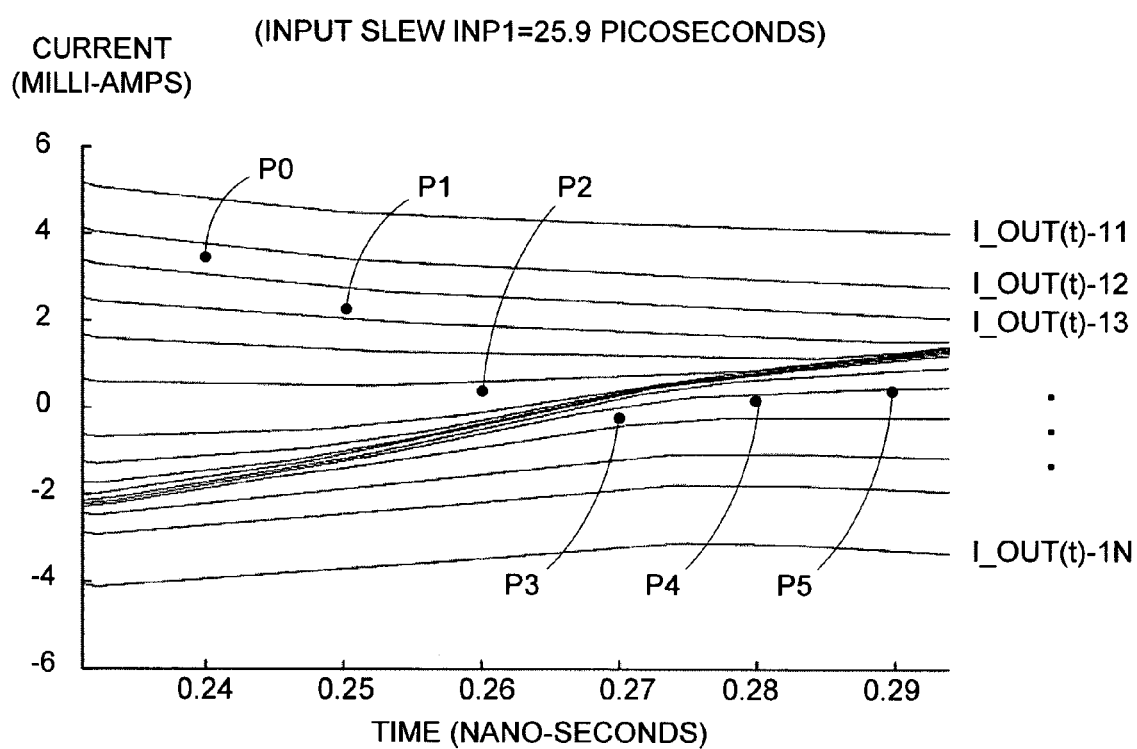
FIG. 8A is an exemplary graph of output current signals across a range of output voltages for a particular driver cell.

FIG. 8A shows a graphical representation of the DRIVER MODELING process described with respect to FIG. 7A. FIG. 8A includes a graph of precharacterized driver output current signals I_OUT(t)-11 through I_OUT(t)-1N from cell entry 600 shown in FIG. 6B, for a given input slew SI1 (in this case 25.9 ps). Table 1, below, lists the parameter values (output current and output voltage) associated with points P0-P5.

TABLE 1

| Time (ps) | Point Label | Output Current | Output Voltage |
|---|---|---|---|
| 0.24 | P0 | IOUTi | Vi |
| 0.25 | P1 | IOUTa | Va |
| 0.26 | P2 | IOUTb | Vb |
| 0.27 | P3 | IOUTc | Vc |
| 0.28 | P4 | IOUTd | Vd |
| 0.29 | P5 | IOUTe | Ve |

Those parameter values are determined as follows.

First, as described above with respect to FIG. 6B, the output current signals (e.g., I_OUT(t)-11 through I_OUT(t)-1N) from the precharacterized cell library (600) that are indexed by the model driver cell (e.g., cell 210), input slew (e.g., SI1), and output voltages (e.g., output voltages V1-VN)) are extracted from the cell library. The initial conditions for the model driver output signal are then specified (step 760 in FIG. 7A). For exemplary purposes, the initial time for the modeling operation depicted in FIG. 8A is selected to be at 0.24 ps on the graph, and the initial output voltage is specified as an output voltage Vi that has a value between precharacterization output voltages V2 and V3 (listed in cell entry 610 in FIG. 6B). Using initial model driver output voltage Vi, the precharacterization output signals I_OUT(t) at time 0.24 ps are interpolated to determine an initial output current Ii (step 770 in FIG. 7A). Thus, initial point P0 is associated with output current Ii and output voltage Vi, as indicated in Table 1. Appropriately, because output voltage Vi is between precharacterization output voltages V2 and V2, output current Ii is between output current signal I_OUT(t)-12 (indexed by output voltage V2) and output current signal I_OUT(t)-13 (indexed by output voltage V3).

Next, output current Ii is used to determine an updated voltage Va for the next time increment at 0.25 ps (step 780 in FIG. 7A). As described above, the change in output voltage over a time increment can be determined by multiplying the initial output current by the time increment and dividing by the output capacitance of the cell. Thus, output voltage Va of point P1 can calculated as follows:

$$Va = Vi + 0.01 * Ii / Cout \qquad (1)$$

where 0.01 is the time increment (0.25 ps-0.24 ps), and Cout is the output capacitance of the model driver cell. Output voltage Va can then be used to determine an associated output current Ia via interpolation of output current signals I_OUT(t) (step 770). Using this iterative process, the output voltage and output current values for points P2-P5 can be determined, thereby creating a complete model driver output voltage signal (Vi through Ve), and a complete model driver output current signal (Ii through Ie).

Figure 5A:
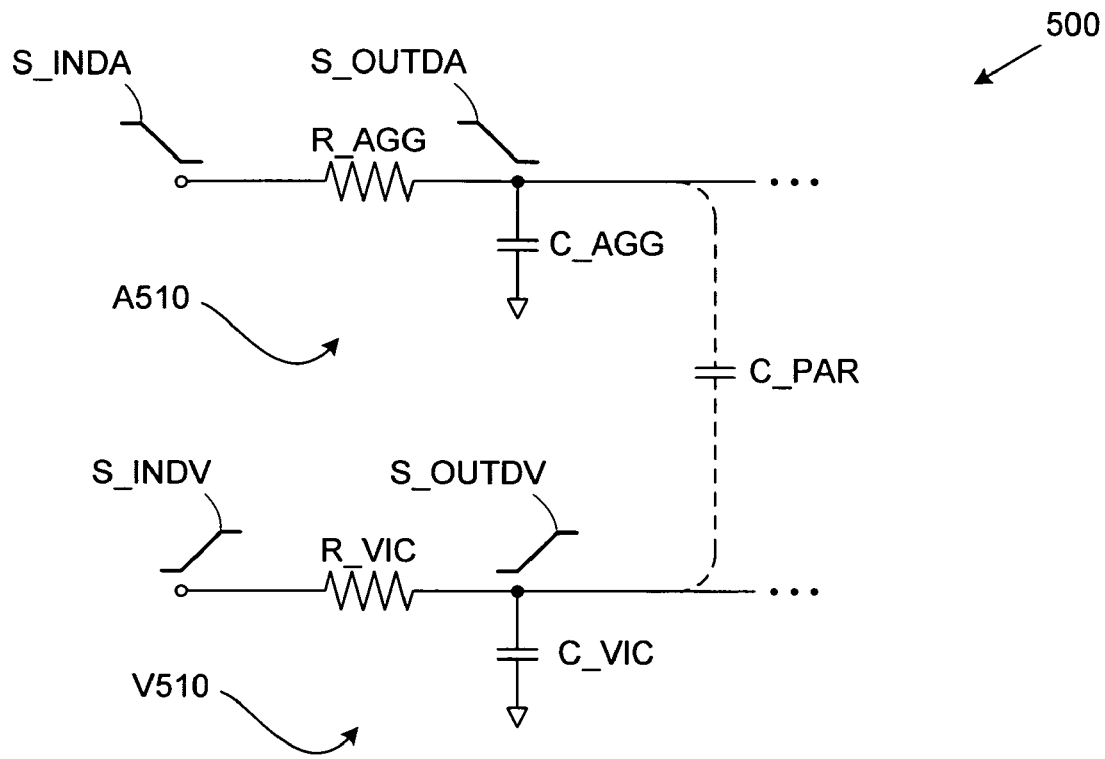
FIG. 5A is a schematic diagram of a multi-driver system that includes an aggressor driver cell capacitively coupled to a victim driver cell.
Figure 5B:
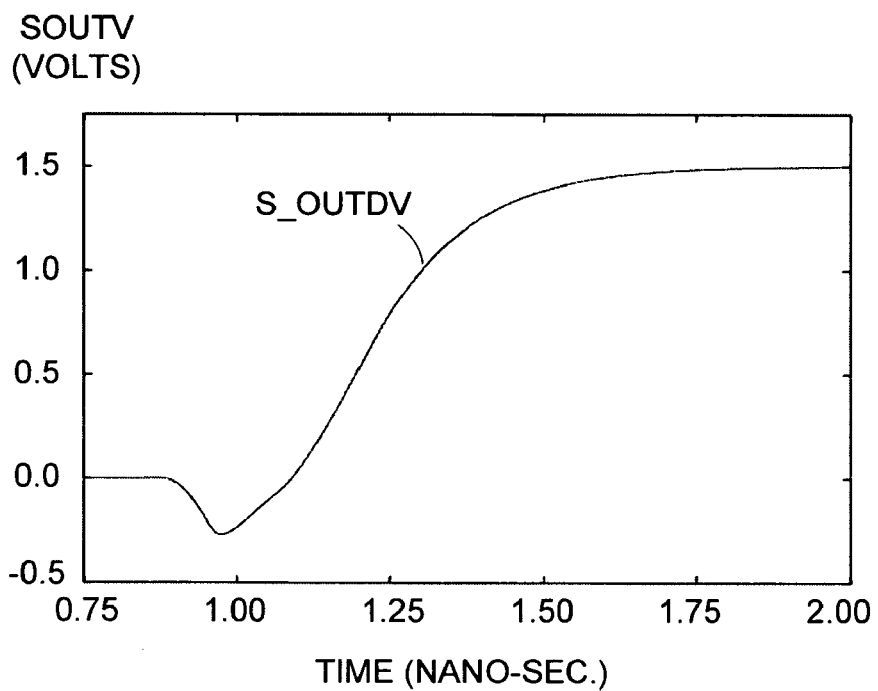
FIG. 5B is a graph of an exemplary output signal from a victim driver cell.
Figure 8B:
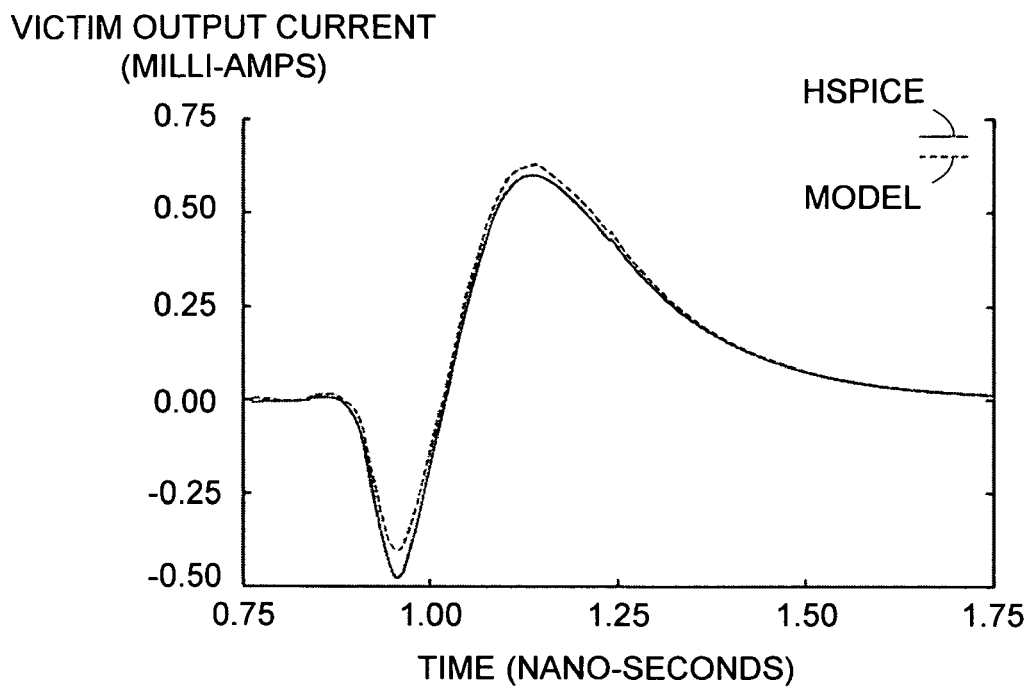
FIGS. 8B and 8C are exemplary graphs of simulated output curves compared to model output curves generated using output current precharacterization data indexed by output voltage.
Figure 8C:
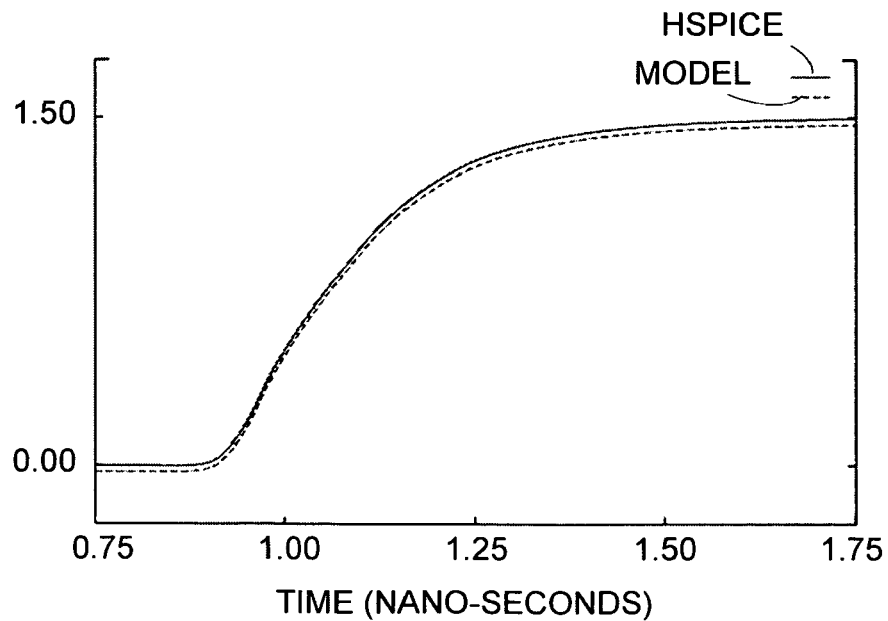

FIGS. 8B and 8C show comparisons between simulated and modeled graphs of driver output current signals and driver output voltage signals, respectively, for a victim driver cell (e.g., victim cell V510 in FIG. 5A). The model driver output signals (generated using the techniques described with respect to FIGS. 7 and 8A, are indicated by the solid curves, while the simulated driver output signals (generated using HSPICE) are indicated by dotted curves.

As shown in FIGS. 8A and 8B, the modeled output signals closely match the simulated HSPICE output signals. In particular, the modeled output current signal in FIG. 8B accurately matches the initial dip and subsequent rise (caused by the victim status of the driver cell) that is exhibited by the HSPICE output current signal. Consequently, the modeled output voltage signal in FIG. 8C accurately matches the HSPICE output voltage signal.

Note that the selection of the precharacterization voltages for the generation and indexing of precharacterization output current signals can play a key role in both the accuracy and efficiency of the modeling described with respect to FIGS. 7 and 8A-8C. As noted above, the range of precharacterization voltages is selected to span the expected range of operating output voltages for the driver cell. Various methods can then be used to select the particular precharacterization output voltages within that range.

For example, in one embodiment, the precharacterization voltages can be generated by specifying voltages at predetermined increments between the maximum precharacterization voltage and the minimum precharacterization voltage. While this approach permits a very straightforward selection methodology, the resulting set of precharacterization voltages may not necessarily provide efficient coverage of the driver performance. For example, an output voltage range that corresponds to output current signals that exhibit a relatively linear response to changes in output voltage need not include a large number of individual precharacterization voltages. In contrast, a voltage range that corresponds to output current signals that exhibit a non-linear response to changes in output voltage should include a larger number of individual precharacterization voltages, so that the accurate interpolation between the output current signals can be performed.

Figure 9:
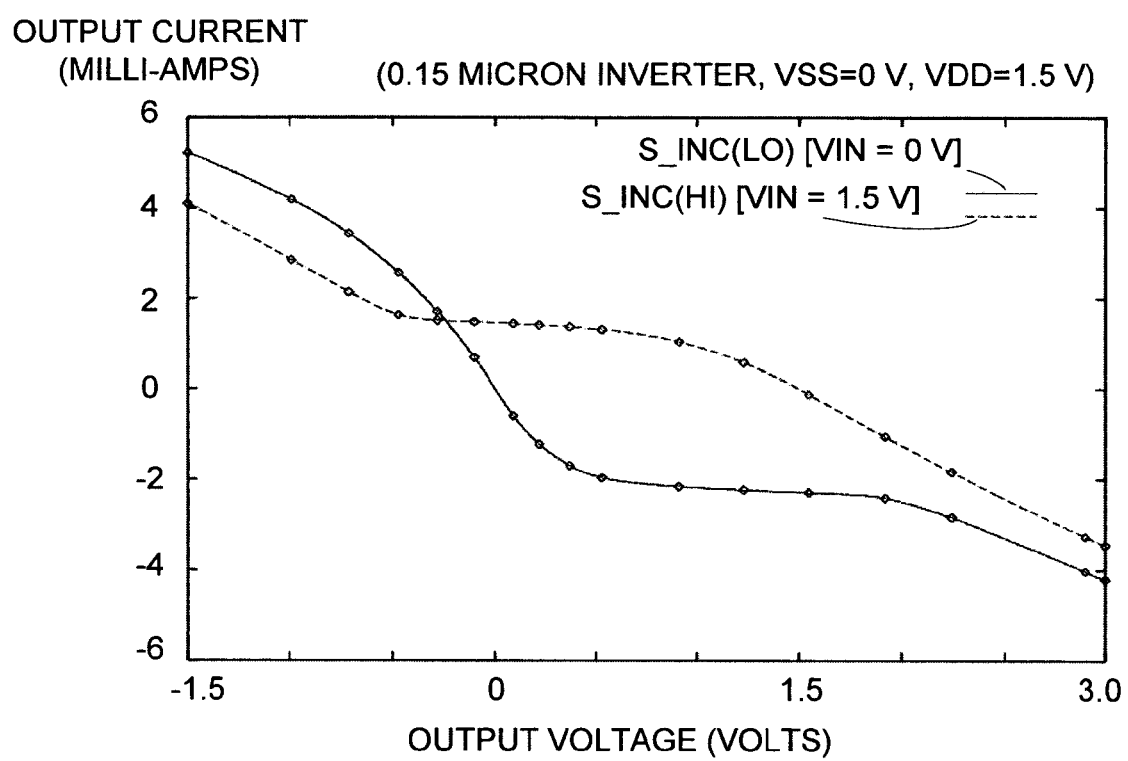
FIG. 9 is an exemplary graph of output current versus output voltage for a particular driver cell for use in precharacterization output voltage selection.

One method for providing such a precharacterization voltage distribution involves generating output current versus output voltage curves for constant input voltages, as shown in FIG. 9. In FIG. 9, precharacterization data of output current versus output voltage for an exemplary driver cell (0.15 μm inverter operating between 0 V and 1.5 V) is graphed. The solid line graph S_INC(LO) is the current response curve for a constant input voltage of 0 V (lower power rail VSS), while the dotted line graph S_INC(HI) the current response curve for a constant input voltage of 1.5 V (upper power rail VDD). For exemplary purposes, the range of output voltages is selected to be from −VDD (i.e., −1.5 V) to +2*VSS (i.e., +3.0 V). Depending on the expected operating conditions for the driver cell, different output voltage ranges could be selected. Thus, generating the two curves can comprise holding the input of the driver cell at the upper and lower power rails while sweeping the output voltage of the driver cell through the selected output voltage range while measuring output current.

The two curves can then be segmented simultaneously to determine the precharacterization output voltages. The segmentation process can be performed by performing a linear interpolation along each curve, and whenever a linear interpolation error greater than a predetermined threshold error is detected along either curve, a sampling point is inserted into both curves. Note that the threshold error can be a constant tolerance band or can be a varying tolerance band(s) that changes across the curve(s). For example, in one embodiment, the tolerance can be tighted around local maxima/minima of one or both of the curves. Each sampling point defines a precharacterization voltage for library generation (as described with respect to FIG. 6B and step 710 in FIG. 7A). In this manner, whenever either of the curves exhibits significant changes (indicating a greater output current sensitivity to output voltage changes), the sampling rate (and therefore the precharacterization voltage density) is increased, while sampling (and precharacterized voltage density) is minimized in regions of low change, thereby minimizing the number of precharacterization output voltages to minimize library size, while still maintaining sufficient resolution to provide accurate interpolation results.

The various embodiments of the structures and methods of this invention that are described above are illustrative only of the principles of this invention and are not intended to limit the scope of the invention to the particular embodiments described. Thus, the invention is limited only by the following claims and their equivalents.

The invention claimed is:

1. A method for creating a precharacterized cell library, the method comprising:

defining a driver model for a cell;

selecting a first set of precharacterization output voltages for the driver model;

holding an output of the driver model at each of the first set of precharacterization output voltages while applying a first input signal to an input of the driver model to generate a first set of output current signals;

compiling the first set of output current signals in a library cell entry for the cell in the precharacterized cell library; and indexing the first set of output current signals in the library cell entry with the first set of precharacterization output voltages and with an input slew of the first input signal.

2. The method of claim 1, wherein the first input signal is of a first signal type,
wherein the first set of output current signals are further indexed by the first signal type, and
wherein the method further comprises:
holding the output of the driver model at each of the first set of precharacterization output voltages while applying a second input signal to the input of the driver model to generate a second set of output current signals, the second input signal being of a second signal type;
compiling the second set of output current signals in the library cell entry; and
indexing the second set of output current signals in the library cell entry with the first set of precharacterization output voltages and the second signal type.

3. A method for creating a precharacterized cell library, the method comprising:
defining a driver model for a cell;
selecting a first set of precharacterization output voltages for the driver model;
holding an output of the driver model at each of the first set of precharacterization output voltages while applying a first input signal to an input of the driver model to generate a first set of output current signals;
compiling the first set of output current signals in a library cell entry for the cell in the precharacterized cell library; and
indexing the first set of output current signals in the library cell entry with the first set of precharacterization output voltages and with an input slew of the first input signal,
wherein selecting the first set of precharacterization output voltages comprises:
selecting an output voltage range;
generating a first current response curve by applying a first fixed voltage to an input of the driver model and recording output current versus output voltage across the output voltage range;
generating a second current response curve by applying a second fixed voltage to the input of the driver model and recording output current versus output voltage across the output voltage range; and
segmenting the first current response curve and the second current response curve, wherein segmenting comprises:
performing linear interpolation along the first current response curve and the second current response curve;
inserting sampling points into the first current response curve and the second current response curve when a linear interpolation error for either of the first current response curve and the second current response curve is greater than a threshold error, the sampling points specifying an output voltage to be included in the first set of precharacterization output voltages; and
repeating the steps of performing linear interpolation and inserting sampling points until the first current response curve and the second current response curve are completely segmented.

4. The method of claim 3, wherein the threshold error is a constant value.

5. The method of claim 3, wherein a value of the threshold error varies across at least one of the first current response curve and the second current response curve.

6. The method of claim 3, wherein the output voltage range comprises an expected output voltage range for the driver model during normal operation.

7. A system for generating a precharacterized cell library entry for a driver cell, the system comprising:
logic for generating a set of precharacterization output voltages;
logic for generating a set of output current signals by applying a first input signal to the driver cell for each of the set of precharacterization output voltages;
logic for compiling the set of output current signals into the cell library entry by indexing the set of output current signals by the set of precharacterization output voltages and a first input slew of the first input signal.

8. The system of claim 7, wherein the logic for generating the set of precharacterization output voltages comprises:
logic for generating a first output current versus output voltage curve for the driver cell by holding an input of the driver cell at a first power rail and sweeping an output of the driver cell through a voltage range while measuring output current;
logic for generating a second output current versus output voltage curve for the driver cell by holding the input of the driver cell at a second power rail and sweeping the output of the driver cell through the voltage range while measuring output current; and
logic for segmenting the first output current versus output voltage curve and the second output voltage versus output current curve to define the set of precharacterization output voltages.

9. A system for generating a precharacterized cell library entry for a driver cell, the system comprising:
logic for generating a set of precharacterization output voltages;
logic for generating a set of output current signals by applying a first input signal to the driver cell for each of the set of precharacterization output voltages; and
logic for compiling the set of output current signals into the cell library entry by indexing the set of output current signals by the set of precharacterization output voltages and a first input slew of the first input signal,
wherein the logic for generating the set of precharacterization output voltages comprises:
logic for generating a first output current versus output voltage curve for the driver cell by holding an input of the driver cell at a first power rail and sweeping an output of the driver cell through a voltage range while measuring output current;
logic for generating a second output current versus output voltage curve for the driver cell by holding the input of the driver cell at a second power rail and sweeping the output of the driver cell through the voltage range while measuring output current; and
logic for segmenting the first output current versus output voltage curve and the second output voltage versus output current curve to define the set of precharacterization output voltages,
wherein the voltage range is greater than a difference between the first power rail and the second power rail.

10. A system for generating a precharacterized cell library entry for a driver cell, the system comprising:
logic for generating a set of precharacterization output voltages;

logic for generating a set of output current signals by applying a first input signal to the driver cell for each of the set of precharacterization output voltages;

logic for compiling the set of output current signals into the cell library entry by indexing the set of output current signals by the set of precharacterization output voltages and a first input slew of the first input signal, wherein the logic for generating the set of precharacterization output voltages comprises:

logic for generating a first output current versus output voltage curve for the driver cell by holding an input of the driver cell at a first power rail and sweeping an output of the driver cell through a voltage range while measuring output current;

logic for generating a second output current versus output voltage curve for the driver cell by holding the input of the driver cell at a second power rail and sweeping the output of the driver cell through the voltage range while measuring output current; and logic for segmenting the first output current versus output voltage curve and the second output voltage versus output current curve to define the set of precharacterization output voltages, wherein the logic for segmenting comprises:

logic for performing linear interpolation along the first output current versus output voltage curve and the second output voltage versus output current curve; and logic for inserting sampling points into the first output current versus output voltage curve and the second output voltage versus output current curve when a linear interpolation error for either of the first output current versus output voltage curve and the second output voltage versus output current curve is greater than a threshold error, wherein voltage values associated with the sampling points comprise the set of precharacterization output voltages.

11. The system of claim 10, wherein the threshold error is a constant value.

12. The system of claim 10, wherein a value of the threshold error varies across at least one of the first output current versus output voltage curve and the second output voltage versus output current curve.

* * * * *